(12) United States Patent
Lee et al.

(10) Patent No.: US 6,842,374 B2
(45) Date of Patent: Jan. 11, 2005

(54) METHOD FOR OPERATING N-CHANNEL ELECTRICALLY ERASABLE PROGRAMMABLE LOGIC DEVICE

(75) Inventors: Kung-Hong Lee, Ping-Tung Hsien (TW); Ching-Hsiang Hsu, Hsin-Chu (TW); Ya-Chin King, Tao-Yuan Hsien (TW); Shih-Jye Shen, Hsin-Chu (TW); Ming-Chou Ho, Hsin-Chu (TW)

(73) Assignee: eMemory Technology Inc., Hsin-Chu (TW)

(*) Notice: Subject to any disclaimer, the term of this patent is extended or adjusted under 35 U.S.C. 154(b) by 0 days.

(21) Appl. No.: 10/248,283

(22) Filed: Jan. 6, 2003

(65) Prior Publication Data

US 2004/0129985 A1 Jul. 8, 2004

(51) Int. Cl.⁷ .................. G11C 16/04; H01L 29/788
(52) U.S. Cl. .................. 365/185.18; 257/314; 257/315
(58) Field of Search ................. 365/183.01, 183.03, 365/185.03, 185.06, 185.07, 182.08, 185.09, 185.1, 185.11, 185.12, 185.13, 185.14, 185.15, 185.16, 185.17, 185.81, 185.19, 185.2, 185.21, 185.22, 185.24, 185.26, 185.27, 185.28, 185.29, 185.3, 185.31, 185.32, 185.33; 438/201, 211, 257

(56) References Cited

U.S. PATENT DOCUMENTS 5,952,700 A * 9/1999 Yoon
6,015,977 A * 1/2000 Zahorik
6,414,872 B1 * 7/2002 Bergemont et al.
6,570,212 B1 * 5/2003 Mehta et al.

* cited by examiner

Primary Examiner—Nathan J Flynn
Assistant Examiner—Kevin Quinto
(74) Attorney, Agent, or Firm—Winston Hsu

(57) ABSTRACT

An electrically erasable programmable logic device (EEPLD) contains a P-type substrate. A first N-type doped region is disposed in the P-type substrate. A first gate, which is used to store data, overlies the P-type substrate and is adjacent to the first N-type doped region. A second N-type doped region is laterally disposed in the P-type substrate. The second N-type doped region is also adjacent to the first gate. A second gate, which acts as a select gate or select gate of the EEPLD, overlies the P-type substrate and is adjacent to the second N-type doped region. A third N-type doped region is disposed in the P-type substrate. The third N-type doped region is adjacent to the second gate. By Applying a sufficient voltage on the first N-type doped region ($V_{BL}$), and changing a select gate voltage ($V_{SG}$) or the third N-type doped region voltage ($V_{SL}$) applied on the second gate of the EEPLD, the operation of the EEPLD can be selectively implemented either under a channel hot hole (CHH) program mode or a channel hot electron (CHE) erase mode.

14 Claims, 9 Drawing Sheets

| Operation | WL1 | WLx | BL0 | BLx | SL1 | SLx |
|---|---|---|---|---|---|---|
| PGM | 4V | 0V | 8V | 0V | 0V | 0V |
| ERS | 1V | 0V | 8V | 0V | 0V | 0V |
| READ | 1.8V | 0V | 0V | 0V | 1V | 0V |

METHOD FOR OPERATING N-CHANNEL ELECTRICALLY ERASABLE PROGRAMMABLE LOGIC DEVICE

BACKGROUND OF INVENTION

1. Field of the Invention

The present invention relates to an electrically erasable programmable logic device (EEPLD) for use as non-volatile memory. More particularly, the present invention relates to an electrically erasable programmable read only memory device capable of implementing multi-level program operations. According to the present invention, the electrically erasable programmable read only memory is compatible with standard CMOS manufacturing processes and the dimension of the electrically erasable programmable read only memory unit is shrunk.

2. Description of the Prior Art

With demands for portable electrical products in recent years, techniques of electrically erasable programmable read-only memory (EEPROM) have been matured and the market has expanded. EEPROM could be applied in digital cameras, video game consoles, personal digital assistants, recording devices of telephones, and programmable IC products. EEPROM is a non-volatile memory, which changes threshold voltage of transistors or memory cells to control open and close of a corresponding gate channel to store memory data instead of lose because of power shutdown.

Single-poly electrically erasable programmable read only memory (EEPROM) device is known in the art. FIG. 1 shows a conventional single-poly electrically erasable programmable read only memory device, which was disclosed in "A single-poly EPROM for custom CMOS logic applications", IEEE Custom Integrated Circuits Conference, p.59–62, 1986, by R. Kazerounian et al. As shown in FIG. 1, the prior art single-poly EPROM 10 is formed on a substrate 12. A large area N-well 14 functioning as a coupling gate with respect to a floating gate 16 is provided. Through the coupling well 14, a high-level voltage such as a voltage of 9V to 12V is capacitively coupled to the floating gate 16, thereby generating channel hot electrons in the substrate 12 under the floating gate 16. The channel hot electrons inject into the floating gate 16 and change the threshold voltage of the floating gate to store binary data such as "0" or "1". Because the single-poly structure is simple, it could be generated in standard CMOS layout processing instead of costly multi-gate technique.

However, one disadvantage of the above-described prior art single-poly EPROM 10 is that its large-area coupling gate, i.e., N-well 14, consumes a lot of valuable chip area. The N-well 14 with a relative big measure has to be applied to couple high potential voltage to the floating gate 16. The measure of the N-well 14 is larger than other parts of the memory cell, which prevents the memory area size applied with the single-poly memory cell 10 from reduction.

SUMMARY OF INVENTION

Accordingly, the primary objective of the present invention is to provide a single-poly electrically erasable programmable logic device(EEPLD), which can be fabricated by using a standard CMOS process and has a shrunk dimension.

Another objective of the present invention is to provide a single-poly electrically erasable programmable read only memory (EEPROM) and a method of operating the same. By either controlling the bit line voltage or controlling the select gate voltage, the EEPROM is capable of being programmed in a multi-level way.

According to the claimed invention, an electrically erasable programmable logic device is provided. The electrically erasable programmable logic device includes a P substrate; a first N-type doped region disposed in the P substrate; a first gate on the P substrate and adjacent to the first N-type doped region, the first gate being in a floating state and used for storing data of the electrically erasable programmable logic device; a second N-type doped region laterally disposed in the P substrate and adjacent to the first gate, wherein the first N-type doped region and the second N-type doped region define a first channel; a second gate as a select gate of the electrically erasable programmable logic device, the second gate being on the P substrate and adjacent to the second N-type doped region; and a third N-type doped region in the P substrate, wherein the second N-type doped region and the third N-type doped region define a second channel.

From another aspect of the claimed invention, an electrically erasable programmable logic device capable of implementing multi-level program is provided. The electrically erasable programmable logic device includes a P substrate; a first N-type doped region disposed in the P substrate; a first gate on the P substrate and adjacent to the first N-type doped region, the first gate being in a floating state and used for storing data of the electrically erasable programmable logic device; a second N-type doped region laterally disposed in the P substrate and adjacent to the first gate, wherein the first N-type doped region and the second N-type doped region define a first channel; a second gate as a select gate of the electrically erasable programmable logic device, the second gate being on the P substrate and adjacent to the second N-type doped region; and a third N-type doped region in the P substrate, wherein the second N-type doped region and the third N-type doped region define a second channel. By changing a select voltage $V_{SG}$ applied to the second gate, or voltage applied to the third N-type doped region, under a relatively high bit line voltage level such as $V_{BL}=7V$ applied to the first N-type doped region, the electrically erasable programmable logic device is selectively operated under a channel hot hole (CHH) program mode, or under a channel hot electron (CHE) program mode.

In accordance with the present invention, the voltage level of the second the N-type doped region of the electrically erasable programmable logic device is controlled by voltages applied to the first N-type doped region, the third N-type doped region, and the second gate, thereby coupling a voltage to the first gate, and thus generates channel hot electrons or channel hot holes in the P substrate under the first gate. The channel hot electrons or channel hot holes inject into the first gate and therefore change the threshold voltage of the first gate, thereby altering logic data of the device.

When the bit line is biasing at a high voltage, for example 8V,the floating gate potential becomes larger than transistors threshold voltage by coupling from the bit line. The floating gate transistor is on, resulting in a high second floating N-type doped node potential. When the select gate transistor is on and the third N-type doped region is grounded, the floating second N-type region potential is then determined by the select gate voltage. The higher the select gate voltage, the lower the floating second N-type doped region and floating gate potential.

When performing a program mode, the first N-type doped region is coupled to a bit line voltage $V_{BL}$, the third N-type doped region and the P substrate are grounded, and the second gate is coupled to a word line voltage $V_{SG}$ so as to form channel hot holes in the first channel region, and the channel hot holes inject into the first gate. Further, by changing the bit line voltage $V_{BL}$ or select gate voltage $V_{SG}$ within a predetermined operation voltage range, the program can be implemented in a multi-level manner due to the different coupled floating gate voltage state.

When performing a erase mode, the first N-type doped region is coupled to a bit line voltage $V_{BL}$, the P substrate is grounded, and the second gate is coupled to a word line voltage $V_{SG}$ and the third N-type doped region is coupled to a source line voltage $V_{SL}$ so as to form channel hot electrons in the first channel region, and the channel hot electrons inject into the first gate.

Other objects, advantages, and novel features of the claimed invention will become more clearly and readily apparent from the following detailed description when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 7 illustrates an operation table including voltage conditions pertaining to "program (PGM)", "erase (ERS)", and "READ" modes in accordance with one preferred embodiment of this invention.

DETAILED DESCRIPTION

Figure 1:
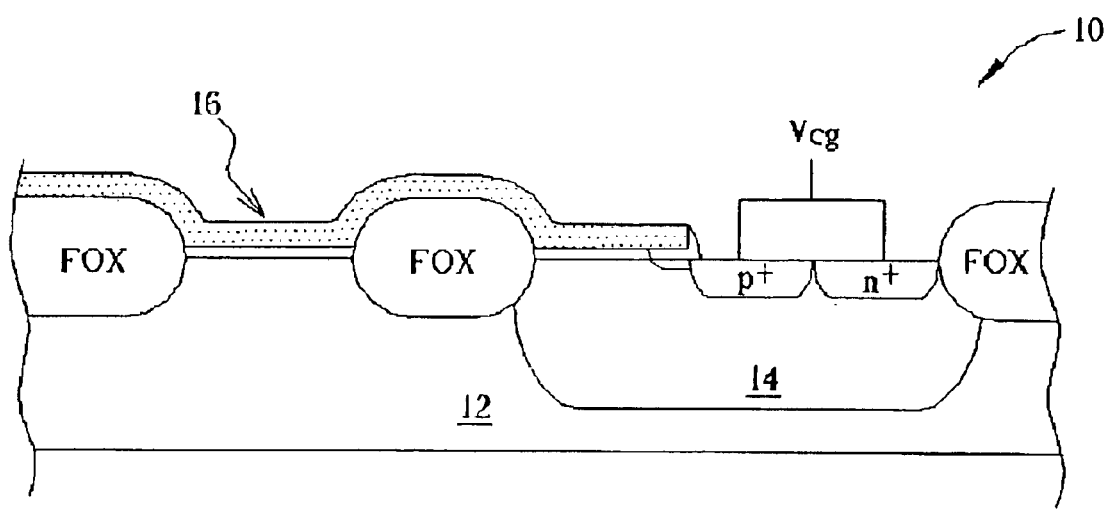
FIG. 1 is a lateral sectional diagram of a prior art single-poly memory cell.
Figure 2:
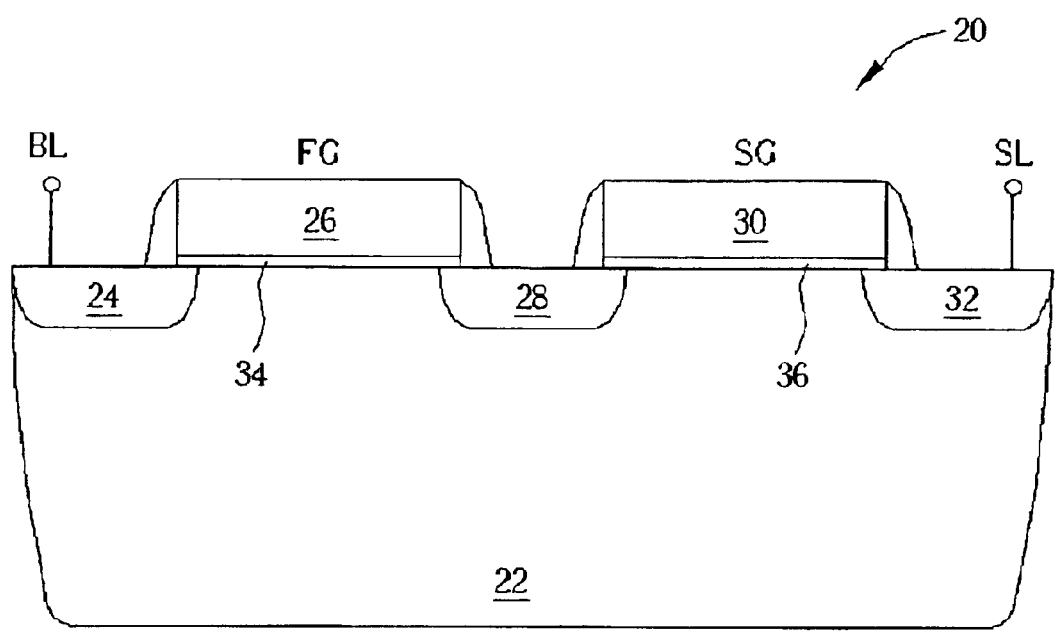
FIG. 2 is an enlarged cross-sectional view schematically showing a single-poly electrically erasable programmable logic device(EEPLD) 20 according to the present invention.

Please refer to FIG. 2. FIG. 2 is an enlarged cross-sectional view schematically showing a single-poly electrically erasable programmable logic device(EEPLD) 20 according to the present invention. As shown in FIG. 2, the EEPLD 20 comprises a P substrate 22, a first N-type ion doped area 24 electrically connected to a bit line BL, a floating gate 26 situated over the P substrate 22 next to the first N-type ion doped area 24 for storing digital data, a second N-type ion doped area 28 situated in the P substrate 22, a select gate 30 electrically connected to a word line (not shown), and a third N-type ion dope area 32 situated in the P substrate 22. A first oxide layer 34 and a second oxide layer 36 are disposed respectively between the floating gate 26 and the substrate 22 and between the select gate 30 and the substrate 22.

One preferred embodiment of the EEPLD 20 for use as a memory unit of a non-volatile memory array will be described below with reference to FIG. 3 to FIG. 8.

Figure 3:
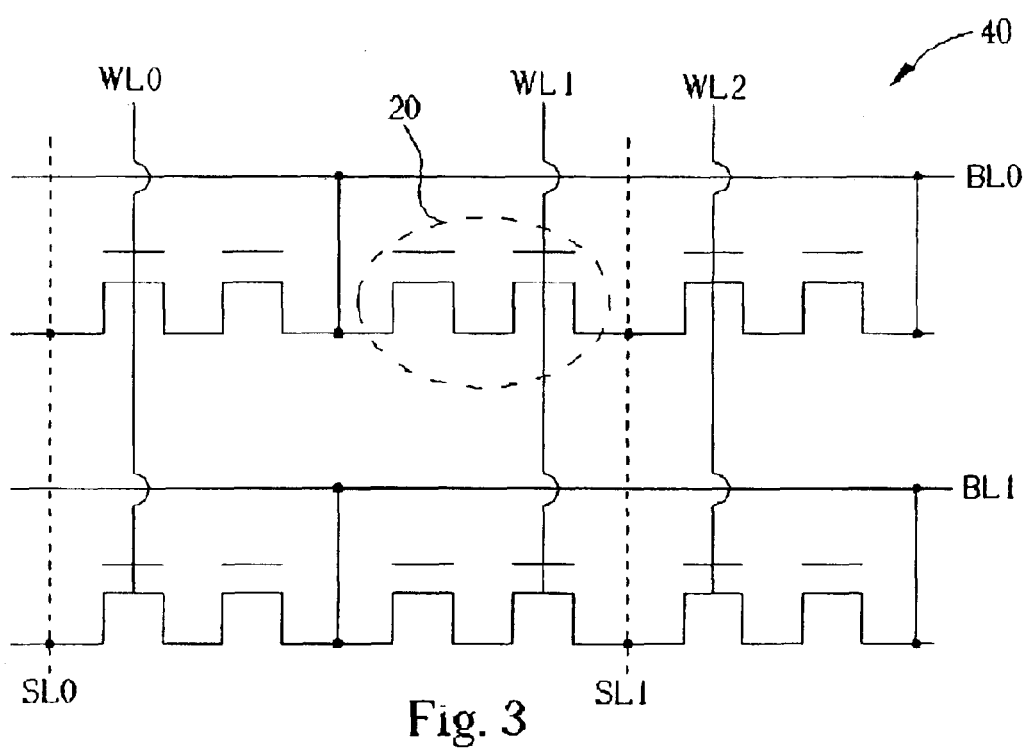
FIG. 3 depicts a portion of the circuit of a memory array including an EEPLD of FIG. 2 acting as a memory unit of the memory array according to the present invention.
Figure 4:
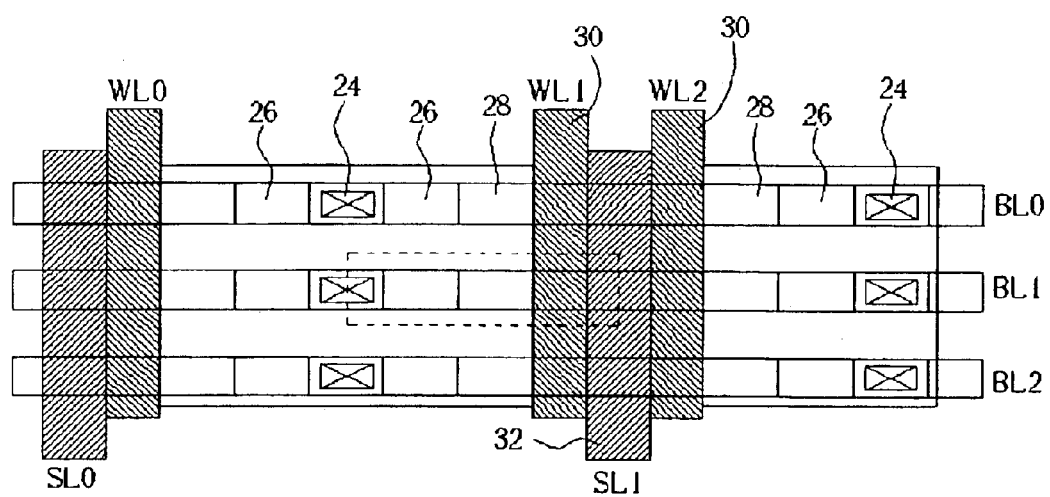
FIG. 4 is an enlarged top view of the layout of the memory array of FIG. 3 according to the present invention.

Please refer to FIG. 3 and FIG. 4. FIG. 3 depicts a portion of the circuit of a memory array 40 including an EEPLD 20 of FIG. 2 acting as a memory unit of the memory array 40. FIG. 4 is an enlarged top view of the layout of the memory array 40 of FIG. 3. It is noted that the memory 40 as set forth in FIG. 3 can be used in applications including, but not limited to, electrically erasable programmable read only memory (EEPROM) fields and one-time programmable (OTP) memories. Generally, as known to those skilled in the art, in the case that the memory 40 is an EEPROM, the memory 40 can be read, programmed, or erased, while in the case that the memory 40 is an OTP memory, it can only be programmed once and read. As shown in FIG. 3, the memory array 40 comprises a plurality of electrically erasable programmable logic devices 20, one of which is indicated as the dotted circle.

In this embodiment, as best seen in FIG. 4, the memory 40 is organized as follows: the second gate 30, the select gate, of logic devices 20 located in the same row connects electrically each other to a word line, WL; the third N-type doped region 32 of logic devices 20 located in the same row connects each other to a source line, SL; the first N-type doped region 24 of logic devices 20 located in the same row connects each other to a bit line, BL. According to locations of each logic device 20 in the array used as a memory cell of the memory 40, a word line could be listed in order of WL0, WL1, WL2, to, WL$_X$, a source line could be listed in order of SL0, SL1, SL2, to, SL$_X$, and a bit line could be listed in order of BL0, BL1, BL2, to, BL$_X$. As illustrated in FIG. 3, due to any two logic devices 20 adjacent to each other are allocated in mirrored symmetry, any two logic devices 20 of neighboring rows located on the same line in the layout could share their two neighboring N-type doped regions 24, and any two logic devices 20 of neighboring rows located in on the same line in the layout could share the two neighboring third doped regions 32 to reduce occupied space.

Taking the logic device 20 in the memory 40 illustrated in FIG. 3 as an example to show how to apply the logic device 20 as a memory cell. As mentioned above, the first gate 26 of the logic device 20 is in a floating state, which means that no external signal or electricity connects the first gate 26 used as the floating gate for the logic device 20. The function of the floating gate 26 is similar to the floating gate of a memory cell in a prior art applied with stacked gate technique to take use of stored electrons amounts in the floating gate 26 to store data by changing the threshold of the floating gate 26. The floating gate 26 being at a high $V_{TH}$ state and Low $V_{TH}$ state represents different value of stored binary digital data in a logic device 20, which could be a logic "1" or "0". The "high $V_{TH}$ state" refers to that due to more electrons stored in the floating gate 26, the floating gate 26 needs a relative high potential to attract enough electrons in the P substrate 22 beneath the floating gate 26 to form a channel in order to connect electrically a first N-type doped region 24 and a second N-type doped region 28. The "low $V_{TH}$ state" means that due to more holes stored in the floating gate 26, the floating gate 26 needs a relative low potential to attract enough electrons in the P substrate 22 beneath the floating gate 26 to form a channel in order to electrically connect a first N-type doped region 24 and a second N-type doped region 28. In the following description, the floating gate 26 being at a high $V_{TH}$ state represents a logic device 20 stored a logic value "0", and the floating gate 26 being at a low $V_{TH}$ state represents a logic device 20 stored a logic value "1"; the opposite definition to the above mentioned is also claimed in the present invention.

Figure 5:
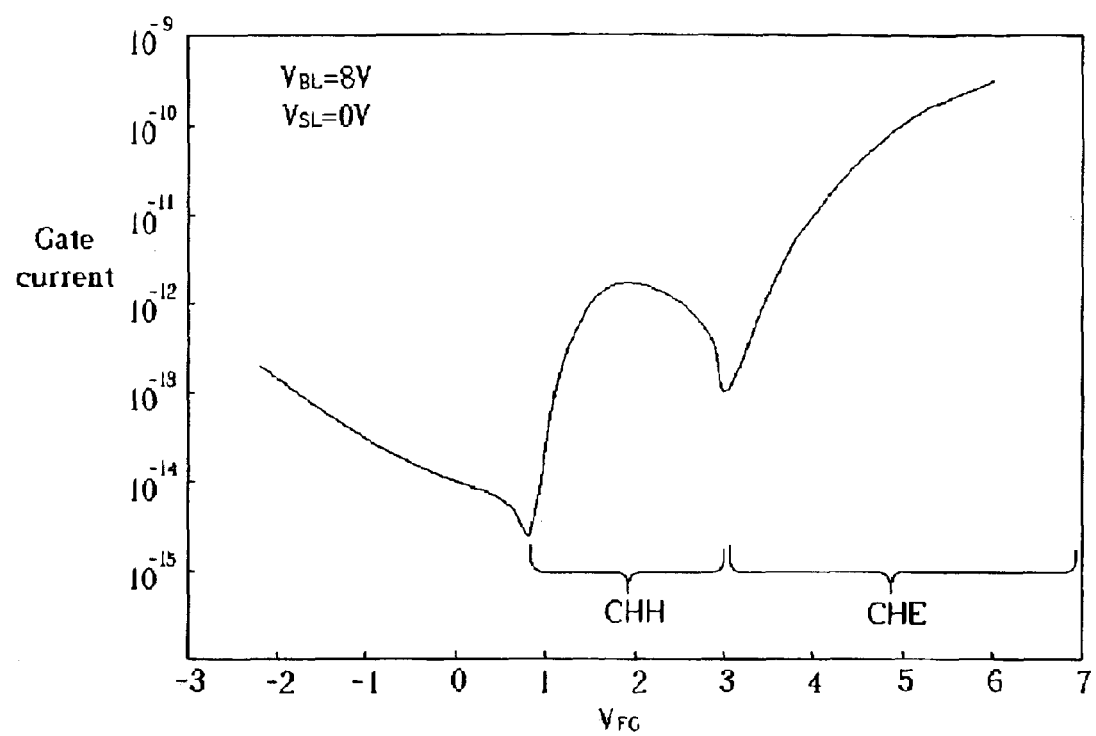
FIG. 5 is a schematic diagram of floating gate channel electricity relative to distributed voltage of the floating gate in the present invention electrically erasable programmable logic device.
Figure 6:
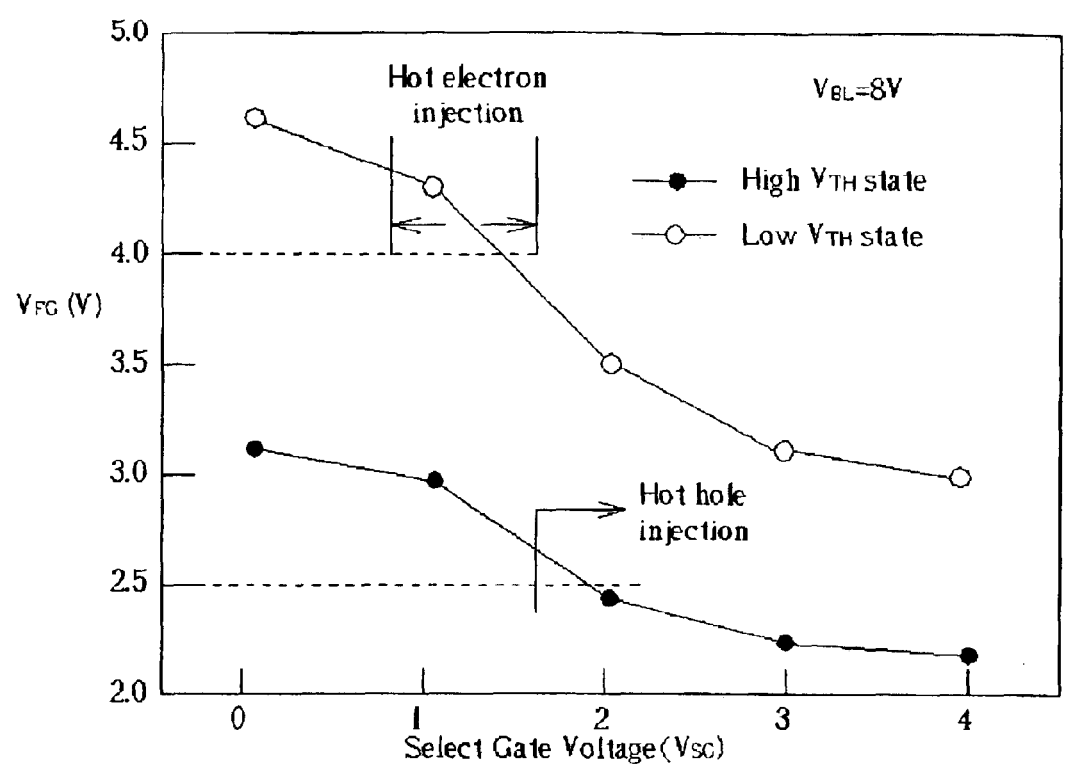
FIG. 6 is a schematic diagram plotting the floating gate voltage $V_{FG}$ versus select gate voltage $V_{SG}$ with respect to the electrically erasable programmable logic device according to the present invention.

Please refer to FIG. 5 and FIG. 6. FIG. 5 is a schematic diagram of floating gate channel electricity relative to distributed voltage of the floating gate 26 in the present invention electrically erasable programmable logic device 20 wherein the horizontal axis represents the potential $V_{FG}$ of the floating gate 26 and the vertical axis represents the gate electricity (gate current) of the floating gate 26. FIG. 6 is a schematic diagram plotting the floating gate voltage $V_{FG}$ versus select gate voltage $V_{SG}$ with respect to the electrically erasable programmable logic device 20 of this invention. Please notice that the represented gate electricity of the floating gate could only represents the absolute value of it but not the direction, labeled as CHH in different zones represents the gate electricity generated by channel hot holes and labeled as CHE represents the gate electricity generated by channel hot electrons. It could be tell in FIG. 5 that during the potential value of the floating gate 26 increases, such as from 2V to 6V, a zone labeled as CHH appears first to represent the channel hot hole effects is more obvious, and a zone labeled as CHE appears latter to represent the channel hot electron effects is more obvious. With reference to FIG. 2, the situation of gate electricity generated by channel hot holes and channel hot electrons is due to that when the floating gate 26 and the select gate 30 have been turned on, electrons will pass the channel beneath the turned-on gates 26 and 30 to flow in the third N-type doped region 32 and the first N-type doped region 24. Some of the electrons will impact ionization to generate electron-hole pairs at the PN junction between the first N-type doped region 24 and P substrate 22, and the lucky hot electrons or holes will tunneling into the floating gate 26 according to different gate voltage potential states, which generates the gate electricity.

Because the floating gate 26 of the logic device 20 of the present invention is in a floating state, the generated voltage potential is achieved by coupling voltage potential of the first N-type doped region 24 (bit line), the P substrate 22 and the second N-type doped region 28 in a certain ratio. Assuming that voltages applied to the bit line, to the P substrate 22, and to the second N-type doped region 28 are, respectively, $V_{BL}$, $V_{PS}$, and $V_X$, the voltage potential of the floating gate $V_{FG}$, could be represented as follows:

$$V_{FG} = \alpha_1 V_{BL} + \alpha_2 V_{PS} + \alpha_3 V_X + (Q/C_{ox})$$

where $\alpha_1$, $\alpha_2$, $\alpha_3$ are coupling ratio respectively of the first N-type doped region 24, the P substrate 22, and the second N-type doped region 28, Q is quantity of charges injected into the floating gate 26, and $C_{ox}$ is capacitance of the first oxide layer 34. Due to the second N-type doped region 28 of the logic device 20 in the present invention is in a floating state too, the voltage potential takes use of the voltage potential $V_{SG}$ of the select gate 30 (WL) to control the resistance of the channel beneath it to determine the coupling level of the voltage potential $V_{SL}$ of the third N-type doped region 32 (SL) to the second N-type doped region 28.

In this embodiment, parameters with respect to "program" and "erase" operations of logic device 20 will be determined by the above-mentioned fixed number $V_{BL}$, $V_{PS}$, $V_{SL}$, and voltage potential $V_{FG}$ of the floating gate 26 must be under perform by changing potential value of $V_{SG}$, by which to change the stored electrons or holes amounts in the floating gate 26 so as to alter the threshold potential of the floating gate 26. The following is the detailed description of how to perform "read", "program", and "erase" in the present embodiment of the present invention logic device 20.

FIG. 7 illustrates an operation table including voltage conditions pertaining to "program (PGM)", "erase (ERS)", and "READ" modes in accordance with the preferred embodiment of this invention. When performing "READ" mode on a selected logic device 20 of memory 40, the first N-type doped region 24 (BL) is grounded. This results in a voltage level at the select gate (WL) 30 that exceeds a voltage level at the third N-type doped region 32 (SL) by a predetermined value (which is usually the threshold of the select gate 30) so as to form a channel in the P substrate 22 beneath the select gate 30 and conduct the second N-type doped region 28 to the third N-type doped region 32. In this embodiment, the select gate 30 is applied with a voltage of 1.8V through the word line WL, the third N-type doped region 32 is applied with a voltage of 1V through the source line SL. It is noted that other select gates 30 and third N-type doped regions 32 of those un-selected logic devices 20 are all grounded (0V). If the floating gate 26 is in a high threshold potential state, meaning that the logic value stored in the logic device 20 is "0", the scale of the potential difference between the first N-type doped region 24, the floating gate 26, and the second N-type doped region 28 will be insufficient to turn on the channel beneath the floating gate 26, thus a sense amplifier (not shown) will read logic "0" from the bit line BL. If the floating gate 26 is at a low threshold potential state, meaning that the logic value stored in the logic device 20 is "1", potential difference between the first N-type doped region 24, the floating gate 26, and the second N-type doped region 28 will be big enough to turn on the channel beneath the floating gate 26, a sense amplifier will read logic "1" from the bit line BL. It is understood that various modifications of the above-mentioned sense amplifier could be used according to different demands and different voltage potential designs.

When performing "program" mode on a selected logic device 20 of memory 40, the first N-type doped region 24 (BL) is coupled to a high voltage, the third N-type doped region 32 (SL) is grounded, and the select gate 30 (WL) is coupled to a predetermined voltage so as to form channel hot holes in the P substrate 22 beneath the floating gate 26. The predetermined voltage value lies in the CHH region as depicted in FIG. 5 to make sure the formation of channel hot holes. In this embodiment, the first N-type doped region 24 is applied with a voltage of 8V through the bit Line BL, and the select gate 30 is applied with a voltage of 4V through the word line WL. It is noted that other select gates 30 and first N-type doped regions 24 of those un-selected logic devices 20 are all grounded. At this phase, if the floating gate 26 is at a high threshold potential state, meaning that the logic value stored in the logic device 20 is "0", due to more electrons stored in the floating gate 26, the floating gate 26 will continue to attract channel hot holes generated in the P substrate 22 beneath the floating gate 26 until excess holes are transitioned to the floating gate 26. Through the above-described process, the floating gate 26 will be switched to a low threshold potential state, and stored logic value in the logic device 20 is programmed to logic "1". If the floating gate 26 is at a low threshold potential state, meaning that the logic value stored in the logic device 20 is "1", due to holes stored in the floating gate 26 in the beginning, the generated channel hot holes will make no change to the stored logic value in the logic device 20 which will remains "1".

When performing "erase" mode on the selected logic device 20 of memory 40, the first N-type doped region 24 (BL) is coupled to a high voltage level, the third N-type doped region 32 (SL) is grounded, and the select gate 30 (WL) is coupled to a predetermined voltage value so as to form channel hot electrons in the P substrate 22 beneath the floating gate 26. The predetermined voltage value lies in the CHE region of FIG. 5 to ensure the formation of channel hot electrons. In this embodiment, the first N-type doped region 24 is applied with a voltage of 8V through the bit line BL, and the select gate 30 is applied with a voltage of 1V through the word line WL. Please notice that other select gates 30 and first N-type doped regions 24 of those un-selected logic devices 20 are all grounded. In this case, if the floating gate 26 is at a low threshold potential state, meaning that the logic value stored in the logic device 20 is "1", due to more holes stored in the floating gate 26, the floating gate 26 will continuously attract channel hot electrons generated in the P substrate 22 until the floating gate 26 stores more electrons. The floating gate 26 will be switched to a high threshold potential state through the process, and stored logic value in the logic device 20 is programmed to be "0". If the floating gate 26 is at a high threshold potential, meaning that the logic value stored in the logic device 20 is "0", due to more electrons stored in the floating gate 26 in the beginning, the generated channel hot electrons will make no change to the stored logic value in the logic device 20 which will remain "0".

In accordance with another preferred embodiment of this invention, when performing "erase" mode on the selected logic device 20 of memory 40, the first N-type doped region 24 (BL) is coupled to a high voltage level, the third N-type doped region 32 (SL) is coupled to a predetermined SL voltage, and the select gate 30 (WL) is coupled to a WL voltage value that is slightly higher than the SL voltage so as to form channel hot electrons in the P substrate 22 beneath the floating gate 26. The predetermined SL voltage lies in the CHE region of FIG. 5 to ensure the formation of channel hot electrons. In this case, by way of example, the first N-type doped region 24 is applied with a voltage of 8V through the bit line BL, the third N-type doped region 32 is applied with a voltage of 2V through the source line SL, and the select gate 30 is applied with a voltage of 3.5V through the word line WL. Please notice that other select gates 30 and first N-type doped regions 24 of those un-selected logic devices 20 are all grounded or floating. If the floating gate 26 is at a low threshold potential state, meaning that the logic value stored in the logic device 20 is "1", due to more holes stored in the floating gate 26, the floating gate 26 will continuously attract channel hot electrons generated in the P substrate 22 until the floating gate 26 stores more electrons. The floating gate 26 will be switched to a high threshold potential state through the process, and stored logic value in the logic device 20 is programmed be "0". If the floating gate 26 is at a high threshold potential, meaning that the logic value stored in the logic device 20 is "0", due to more electrons stored in the floating gate 26 in the beginning, the generated channel hot electrons will make no change to the stored logic value in the logic device 20 which will remain "0".

Figure 8:
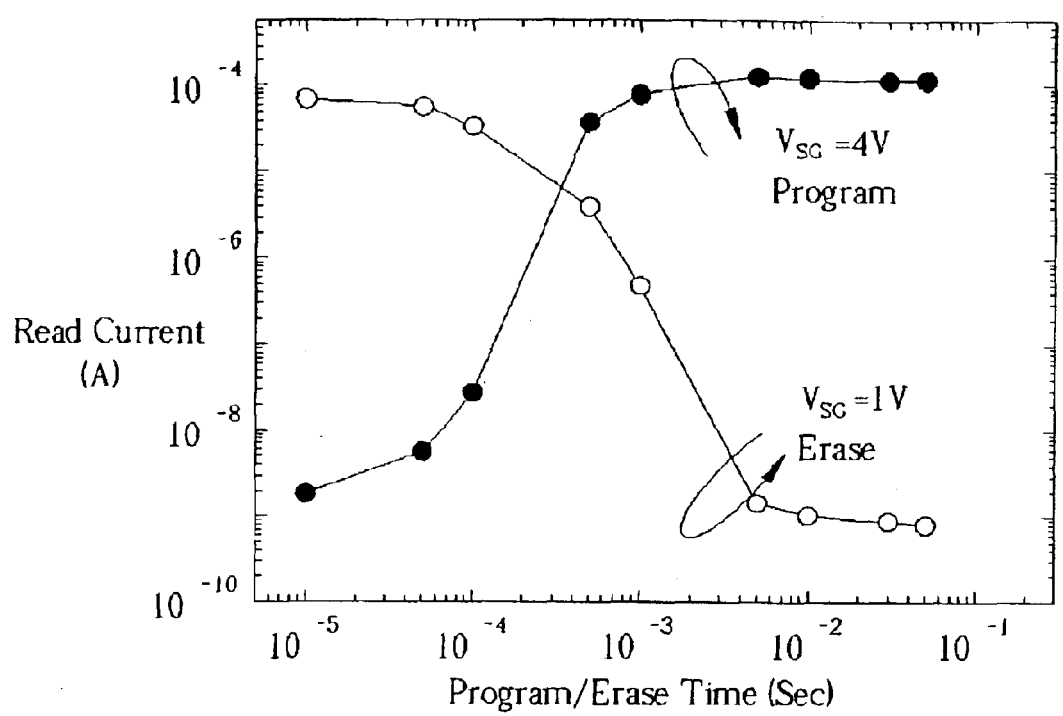
FIG. 8 is a schematic diagram plotting the read current versus stress time under bit line voltages $V_{BL}$=8V and different select gate voltage (program @ $V_{SG}$=4V, erase @ $V_{SG}$=1V).

In accordance with still another preferred embodiment of this invention, when performing "erase" mode on the selected logic device 20 of memory 40, the first N-type doped region 24 (BL) is coupled to a high voltage level, the third N-type doped region 32 (SL) is grounded, and the P substrate 22 is coupled to a predetermined negative voltage value, and the select gate 30 (WL) is applied with a predetermined positive voltage value so as to form channel hot electrons in the P substrate 22 beneath the floating gate 26. The predetermined positive voltage value lies in the CHE region of FIG. 5 to ensure the formation of channel hot electrons. In this case, by way of example, the first N-type doped region 24 is applied with a voltage of 6V through the bit line BL, the third N-type doped region 32 is grounded, the P substrate 22 is applied with a voltage of 2V, and the select gate 30 is applied with a voltage of 1.5V through the word line WL. Please notice that other select gates 30 and first N-type doped regions 24 of those un-selected logic devices 20 are all grounded or floating. If the floating gate 26 is at a low threshold potential state, meaning that the logic value stored in the logic device 20 is "1", due to more holes stored in the floating gate 26, the floating gate 26 will continuously attract channel hot electrons generated in the P substrate 22 until the floating gate 26 stores more electrons. The floating gate 26 will be switched to a high threshold potential state through the process, and stored logic value in the logic device 20 is programmed to be "0". If the floating gate 26 is at a high threshold potential, meaning that the logic value stored in the logic device 20 is "0", due to more electrons stored in the floating gate 26 in the beginning, the generated channel hot electrons will make no change to the stored logic value in the logic device 20 which will remain "0". The example measurement result of program and erase characteristics are shown in FIG. 8. Read current is measured under: $V_{SG}=1.8V$, $V_{SL}=1V$, $V_{PW}=V_{BL}=0V$.

Figure 9:
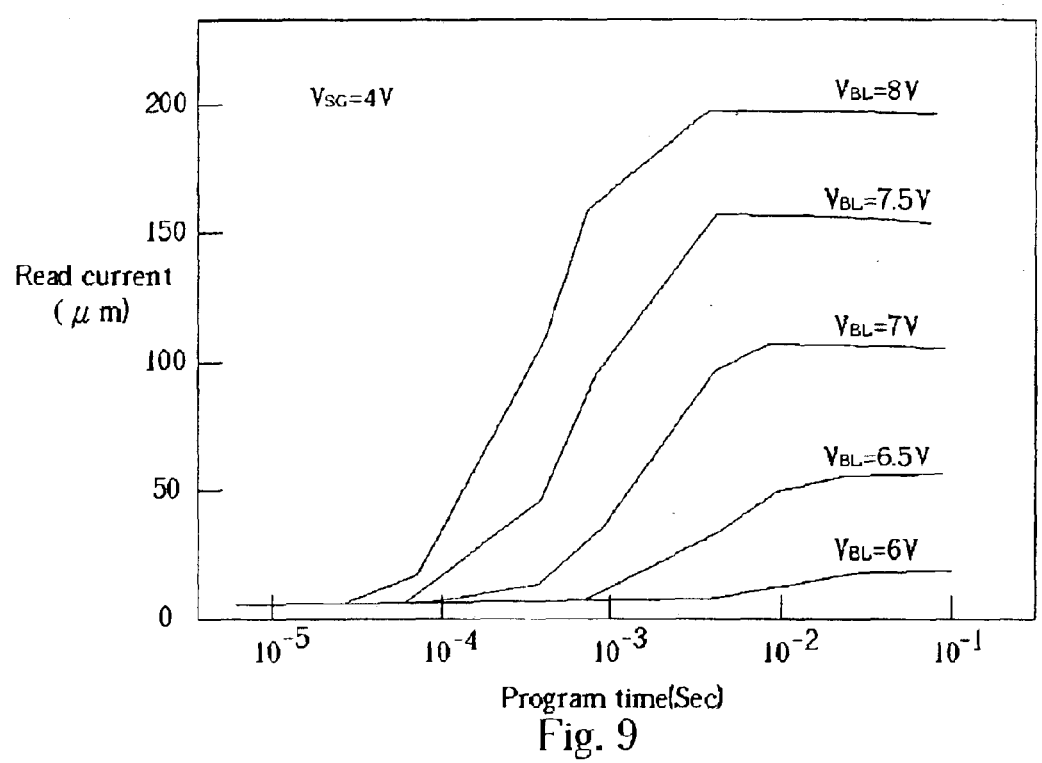
FIG. 9 is a schematic diagram plotting the read current versus program time under different bit line voltages $V_{BL}$ and fixed select gate voltage ($V_{SG}$=4V) during the program operation of the electrically erasable programmable logic device according to the present invention.

FIG. 9 is a schematic diagram plotting the read current versus program time under different bit line voltages $V_{BL}$ and fixed select gate voltage ($V_{SG}=4V$) during the program operation of the electrically erasable programmable logic device according to the present invention. The electrically erasable programmable logic devices employ a new self-converged dynamic carrier injection mechanism for the multilevel program. Using simple constant bit line voltage control the floating gate potential and injected carrier to achieve multi-bits per cell. In FIG. 9, under a select gate voltage $V_{SG}=4V$, a source line voltage $V_{SL}=0V$, by controlling the bit line voltage $V_{BL}$, the electrically erasable programmable logic devices are programmed for the same period of time such as 0.1 seconds to 0.01 seconds, preferably 50 ms, different read currents ranging from 10 $\mu A$ to 200 $\mu A$ are obtained. The different bit line voltage leads to different initial $V_{FG}$ and $I_{FG}$ and cause different total injected quantity of holes, self-converged floating gate voltage and read current.

In contrast to the prior art, the electrically erasable programmable logic device of this invention controls the voltage potential of a second N-type doped region by the voltage level of the select gate and further controls the voltage level of the floating gate to generate channel hot holes or channel hot electrons in the P substrate beneath the floating gate. The generated channel hot holes and channel hot electrons inject into the floating gate and change the threshold voltage of the floating gate thereby altering data stored in the floating gate. The voltage level of the second N-type doped region is determined by voltage level $V_{SG}$ applied to the select gate, which controls resistance of the first channel thereby deciding magnitude of a coupling effect between voltage level $V_{SL}$ of the third N-type doped region and the second N-type doped region. Therefore, the present invention electrically erasable programmable logic device does not need a large area N-well acting as a coupling gate of the floating gate. In addition, the present invention can implement binary data program and multi-level data program.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. An operating method for an N-channel electrically erasable programmable logic device, the electrically erasable programmable logic device comprising:

a P substrate;

a first N-type doped region disposed in the P substrate;

a first gate on the P substrate and adjacent to the first N-type doped region, the first gate being in a floating state and used for storing data of the electrically erasable programmable logic device;

a second N-type doped region laterally disposed in the P substrate and adjacent to the first gate, wherein the first N-type doped region and the second N-type doped region define a first channel;

a second gate as a select gate of the electrically erasable programmable logic device, the second gate being on the P substrate and adjacent to the second N-type doped region; and a third N-type doped region in the P substrate, wherein the second N-type doped region and the third N-type doped region define a second channel;

the operating method comprising:

performing a program mode, wherein the first N-type doped region is coupled to a bit line voltage $V_{BL}$, the third N-type doped region and the P substrate are grounded, and the second gate is coupled to a word line voltage $V_{SG}$ so as to form channel hot holes in the P substrate, and the channel hot holes inject into the first gate; wherein by changing the word line voltage $V_{SG}$ applied to the second gate, the electrically erasable programmable logic device is selectively operated under a channel hot hole (CHH) program mode, or under a channel hot electron (CHE) program mode; and by changing the bit line voltage $V_{BL}$ within a predetermined operation voltage range, the program mode is a multi-level data program operation.

2. The operating method for an N-channel electrically erasable programmable logic device of claim 1 further comprising a first oxide layer located under the first gate.

3. The operating method for an N-channel electrically erasable programmable logic device of claim 1 further comprising a second oxide layer located under the second gate.

4. The operating method for an N-channel electrically erasable programmable logic device of claim 1 wherein the second N-type doped region is in a floating state, and a voltage level of the second N-type doped region is determined by the word line voltage $V_{SG}$ applied to the second gate, which controls resistance of the second channel thereby deciding magnitude of a coupling effect between a voltage level $V_{SL}$ of the third N-type doped region and the second N-type doped region.

5. The operating method for an N-channel electrically erasable programmable logic device of claim 1 wherein the program mode is a binary program operation, the bit line voltage $V_{BL}$ is fixed.

6. The operating method for an N-channel electrically erasable programmable logic device of claim 1 wherein the predetermined operation voltage range is between 5V and 8V.

7. The operating method for an N-channel electrically erasable programmable logic device of claim 1 wherein a voltage of $V_1$ is applied to the second gate to operate the electrically erasable programmable logic device under the CHH program mode.

8. The operating method for an N-channel electrically erasable programmable logic device of claim 7, wherein $V_1$ is between 2V and 5V.

9. The operating method for an N-channel electrically erasable programmable logic device of claim 1 wherein a voltage of $V_2$ that is higher than threshold voltage of the second gate is applied to the second gate so as to operate the electrically erasable programmable logic device under the CHE program mode.

10. The operating method for an N-channel electrically erasable programmable logic device of claim 9 wherein $V_2$ is between 0.5V and 1.5V.

11. The operating method for an N-channel electrically erasable programmable logic device of claim 1 wherein when performing an erase mode, the first N-type doped region is coupled to a bit line voltage $V_{BL}$, the third N-type doped region is applied with a source line voltage $V_{SL}$, the P substrate is grounded, and the second gate is coupled to a word line voltage $V_{SG}$ that is higher than threshold voltage of the second gate so as to form channel hot electrons in the P substrate underneath the first gate, and the channel hot electrons inject into the first gate.

12. The operating method for an N-channel electrically erasable programmable logic device of claim 11 wherein the source line voltage $V_{SL}$ is between 1V and 3V, the word line voltage $V_{SG}$ is between 2V and 4.5V.

13. The operating method for an N-channel electrically erasable programmable logic device of claim 1 wherein when performing an erase mode, the first N-type doped region is coupled to a bit line voltage $V_{BL}$, the third N-type doped region is grounded, the P substrate is coupled to a negative voltage $V_{PL}$, and the second gate is coupled to a word line voltage $V_{SG}$ that is higher than threshold voltage of the second gate so as to form channel hot electrons in the P substrate underneath the first gate, and the channel hot electrons inject into the first gate.

14. The operating method for an N-channel electrically erasable programmable logic device of claim 13 wherein $V_{PL}$ is between −1V and −3V, $V_{SG}$ is between 1 and 2.5V.

* * * * *